United States Patent [19]

Kinoshita

[11] Patent Number: 5,038,055
[45] Date of Patent: Aug. 6, 1991

[54] PEAK LEVEL DETECTING DEVICE AND METHOD

[75] Inventor: Osamu Kinoshita, Tokyo, Japan

[73] Assignee: Kabushiki Kaisha Toshiba, Kawasaki, Japan

[21] Appl. No.: 407,156

[22] Filed: Sep. 14, 1989

[30] Foreign Application Priority Data

Dec. 2, 1988 [JP] Japan .................................. 63-305783

[51] Int. Cl.$^5$ ............................................. H03K 5/153
[52] U.S. Cl. .................................... 307/351; 307/359; 307/491; 307/494
[58] Field of Search ............... 307/351, 354, 359, 491, 307/494

[56] References Cited

U.S. PATENT DOCUMENTS 4,533,844  8/1985  Miller et al. ...................... 307/351

FOREIGN PATENT DOCUMENTS 59-57171  4/1984  Japan .

OTHER PUBLICATIONS

D. B. White, "Peak Detector For High Speed Semi-Repetitive Voltage Peaks", IBM Tech. Discl. Bull., vol. 22, No. 3, Aug. 1979, pp. 1118-1119.

N. D. Nguyen, "Simple Peak Detector", IBM Tech. Discl. Bulletin, vol. 27, No. 2, Jul. 1984, pp. 1368-1369.

*Primary Examiner*—John Zazworsky
*Attorney, Agent, or Firm*—Cushman, Darby & Cushman

[57] ABSTRACT

A device and method for detecting a peak level of an input signal. The input signal is amplified by a first amplifier. A switching signal corresponding to an output signal from the first amplifier is generated and a held peak level of the switching signal is fed back to the first amplifier negatively. Also, the switching signal is amplified by a second amplifier. A compensator generates a bias compensating signal for supplying to the first and second amplifiers to offset for the current drain that would otherwise occur.

25 Claims, 5 Drawing Sheets

PEAK LEVEL DETECTING DEVICE AND METHOD

BACKGROUND OF THE INVENTION

1. Field of the Invention

This invention relates to a device and method for detecting peak level. More specifically, this invention relates to a peak level detecting device and method which has application in digital communication equipment.

2. Description of the Related Art

A peak level detecting circuit is used for an automatic gain control (AGC) circuit in digital communication equipment, and an alarm circuit etc. For example, an AGC circuit compares the peak level of an output signal from a receiving amplifier with a predetermined level and also controls to maintain constant an amplitude of the output signal from the amplifier by changing the gain of the amplifier in accordance with a compared result. In a peak level detecting circuit which is used in a negative feedback control, it is necessary to decrease errors of peak level detection in order to improve a control accuracy. The errors of peak level detection include static errors due to change of temperature and supply voltage fluctuation etc. and also include dynamic errors due to the mark-space ratio of an input digital signal. The static errors may be relatively simply decreased by a compensating circuit having characteristics corresponding to the change of temperature and supply voltage fluctuation. However, the dynamic errors are difficult to compensate because of its dependence on properties of input signals.

FIG. 8 shows a peak level detecting circuit in which the errors of peak level detection, due to a change of the mark-space ratio, have been decreased. This circuit has a differential amplifier 81, a switching transistor 82, a capacitor 83 and a buffer amplifier 84. The differential amplifier 81 includes transistors Q1, Q2 and Q3 and a resistor R1. An input signal is supplied to the base of the transistor Q2. An output signal from the amplifier 81 is supplied to the base of the switching transistor 82 which is connected to the collector of the transistor Q3. The capacitor 83 holds a peak level of an output signal from the switching transistor 82 corresponding to the output signal from the amplifier 81. A potential of the capacitor 83 is fed back to the base of the transistor Q3 in the differential amplifier 81 as negative feedback.

The buffer amplifier 84 includes transistors Q5 and Q6 and a resistor R6. The potential of the capacitor 83 corresponds to the peak level of the output signal from the differential amplifier 81 and is also supplied to the base of the transistor Q5. An output signal of the circuit is obtained from a connected terminal of the emitter of the transistor Q5 and the collector of the transistor Q6 in the buffer amplifier 84. The transistors Q1 and Q6 have their respective bases connected to a constant voltages $V_B$, and respectively form parts of the amplifier 81 and 84. These transistors are used for forming current sources and may be replaced with resistors to simplify a constitution of the circuit.

FIG. 9(a) shows waveforms of input signals in the circuit shown in FIG. 8. FIG. 9(b) shows waveforms of signals at a connecting terminal T between the switching transistor 82 and the capacitor 83. Also, FIG. 9(c) shows waveforms of output signals in the circuit shown in FIG. 8. In FIGS. 9(a), 9(b), and 9(c), waveforms shown by dashed lines correspond to signals which have two times the mark-space ratio of signals shown by continuous lines. When the input signal to the circuit becomes a high level, an output potential from the differential amplifier 81 also correspondingly increases. When the output potential becomes higher by the base-emitter voltage $V_{BE}(=0.7$ V) of the switching transistor 82 than a potential of the capacitor 83, the transistor 82 turns on and conducts and the capacitor 83 is charged. The potential of the capacitor 83 rises due to the charge and is fed back to the differential amplifier 81 as negative feedback. Thus, in the collector of the transistor Q3, an amplified signal corresponding to the difference between potentials of the input signal and the capacitor 83 appears as the output signal of the differential amplifier 81. The charging of the capacitor 83 is continued until both potentials of the capacitor 83 and the input signal to the differential amplifier 81 substantially coincide.

When the input signal to the differential amplifier 81 becomes a low level, the output potential from the amplifier 81 decreases and the switching transistor 82 is cut off. Then, the capacitor 83 is discharged through the relatively high input resistances of the differential amplifier 81 and the buffer amplifier 84, and the potential of the capacitor 83 decreases gradually with time. The errors in the peak detector accumulate due to a loss of charge caused by the discharge of the capacitor 83, and due to an insufficient charge of the capacitor 83. The loss of charges is less if the discharging time becomes short and the capacitor 83 may be charged more as the charging time becomes long. Therefore, as shown in FIG. 9(c), when the mark-space ratio of the input signal is great, peak detecting errors E are inclined to decrease.

In the peak level detecting circuit shown in FIG. 8, when a gain of the differential amplifier 81 is set to be large, it may be possible to decrease the errors in charging time too much by a function of the negative feedback. However, in discharging time, the capacitor 83 may be discharged by both the input bias currents Ib3 and Ib5 of the differential amplifier 81 and the buffer amplifier 84. Thus, the loss of charges by the discharge increases in the peak level detecting circuit having the differential amplifier 81 as compared with the no feedback type circuit without the differential amplifier 81. Therefore, peak detecting errors may not be decreased too much in charging and discharging time as a whole.

When a first stage transistor of the differential amplifier 81 is replaced with a Darlington circuit, the input bias current can be decreased in the differential amplifier 81 due to decrease of the operating current. However, the Darlington circuit deteriorates the frequency characteristics of an amplifier. The differential amplifier 81 needs to be wide band in order to properly amplify the input signal. Also, it is necessary to prevent the output waveform from deteriorating due to decrease of bandwidth so that peak detecting errors will not increase in charging time.

SUMMARY OF THE INVENTION

It is an object of the present invention to reduce peak detecting errors due to change of the mark-space ratio.

It is a further object of the present invention to decrease loss of charges in a capacitor which holds a signal level corresponding to peak level of an input signal.

It is still a further object of the present invention to compensate input bias currents of an amplifier which is included in peak level detecting device. To achieve the above objects and in accordance with the purpose of the invention, as embodied and broadly described herein, the invention provides a device for detecting peak level of an input signal. The input signal is amplified by a first amplifier. A switching signal corresponding to an amplified signal from the first amplifier is generated. Peak level of the switching signal is held and fed back to the first amplifier negatively. A second amplifier amplifies the switching signal.

A bias compensating signal is generated by a compensator and supplied to the first and second amplifiers.

BRIEF DESCRIPTION OF THE DRAWINGS

The present invention is best understood with reference to accompanying drawings in which.

DETAILED DESCRIPTION OF THE PREFERRED EMBODIMENT

Figure 1:
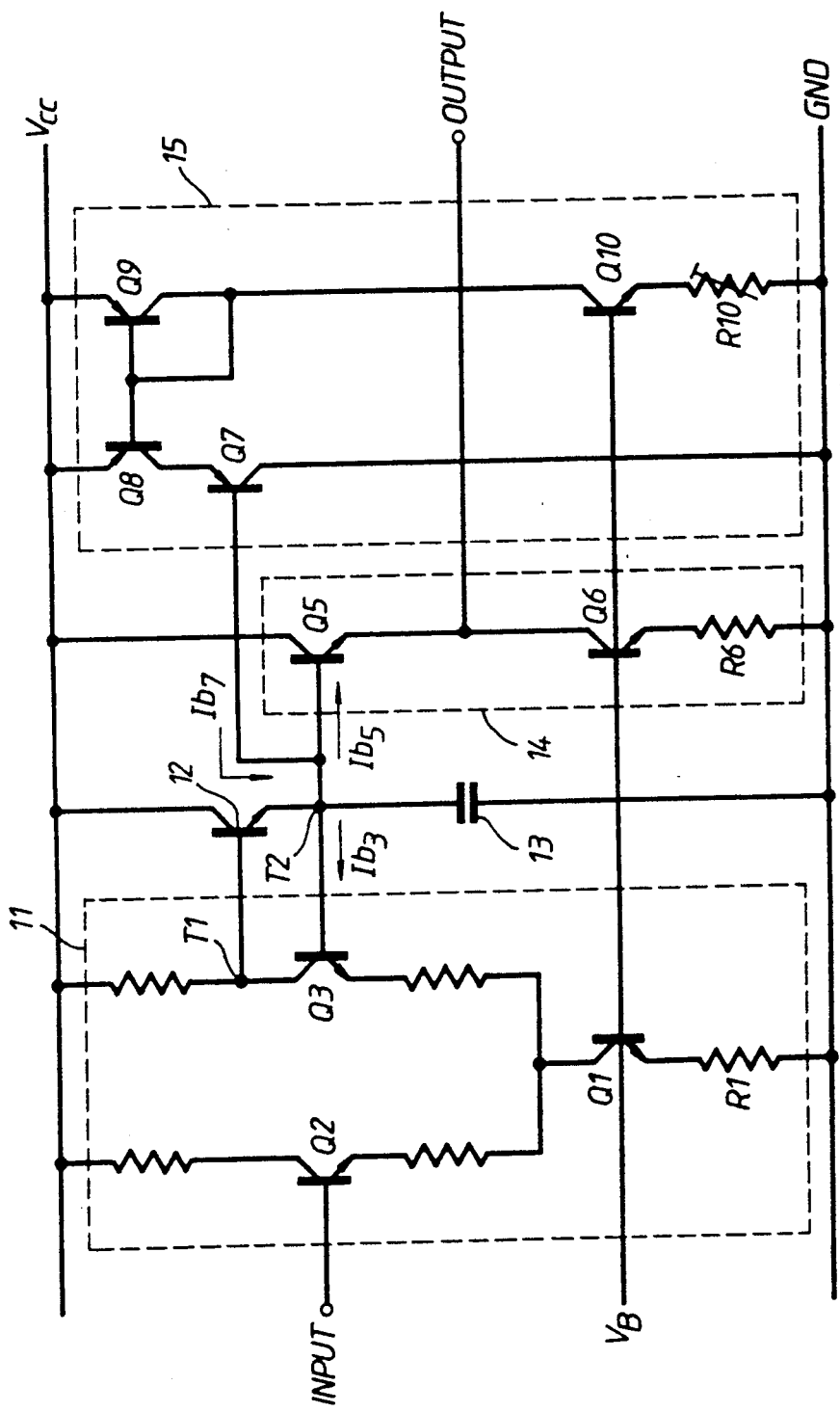
FIG. 1 is a circuit diagram of a device according to one embodiment of this invention.

Referring to the accompanying drawings, an embodiment of the present invention will be described. In the drawings, the same numerals are applied to the similar elements in the drawings, and therefore the detailed description thereof is not repeated.

As shown in FIG. 1, a peak level detecting device includes a differential amplifier 11, a switching transistor 12, a capacitor 13, a buffer amplifier 14 and a current compensating circuit 15. The differential amplifier 11 has transistors Q1, Q2 and Q3 and a resistor R1. An input signal to the device is supplied to the base of the transistor Q2. An output terminal $T_i$ of the differential amplifier 11 (the collector of the transistor Q3) is connected to the base of the switching transistor 12. The collector of the switching transistor 12 is connected to a voltage source Vcc. Also, the emitter of the transistor 12 is connected to the capacitor 13 and the base of the transistor Q3 in the differential amplifier 11 for forming a negative feedback circuit. The buffer amplifier 14 has transistors Q5 and Q6 and a resistor R6. The base of the transistor Q5 in the amplifier 14 is connected to a terminal T2 at which the emitter of the switching transistor 12 and the capacitor 13 are connected. The current compensating circuit 15 has transistors Q7, Q8, Q9 and Q10 and the emitter resistor R10. The base of the transistor Q7 in the circuit 15 is connected to the terminal T2. Transistors Q1, Q6 and Q10, each included in the differential amplifier 11, the buffer amplifier 14 and the current compensating circuit 15, are transistors for forming current sources. Each base of the transistors Q1, Q6 and Q10 is connected commonly and provided with a constant voltage $V_B$.

In operation, the differential amplifier 11 amplifies the input signal which is supplied to the base of the transistor Q2. An output signal from the amplifier 11 is supplied to the base of the switching transistor 12 which generates a switching signal corresponding to the output signal. The capacitor 13 holds the peak level of the switching signal and this level of the capacitor 13 is fed back as negative feedback to the base of the transistor Q3 in the differential amplifier 11. The level of the capacitor 13 corresponds to the peak level of the output signal from the differential amplifier 11 and is also supplied to the base of the transistor Q5 in the buffer amplifier 14. The capacitor 13 is charged until the level of the capacitor 13 becomes substantially the same level (peak level) as the input signal to the differential amplifier 11. The buffer amplifier 14 amplifies the switching signal from the switching transistor 12.

The current compensating circuit 15 generates a bias compensating signal. Transistors Q8 and Q9 are PNP transistors which constitute a current mirror and the transistor Q7 is a PNP transistor acting as a load of a current mirror output. It is well known that the current mirror may produce output currents approximately equal to drive current due to the similar characteristics of the transistors forming the circuit. Thus, it is possible to obtain current from the collector of the transistor Q8 approximately equal to the collector current of the transistor Q9. Collector current of the transistor Q8 flows from the emitter of the transistor Q7 to GND through the collector of the transistor Q7. Also, base current $Ib_7$ of the transistor Q7 is the output current of the current compensating circuit 15 and is supplied to the differential amplifier 11 and the buffer amplifier 14 as the bias compensating current signal. An amount of the base current $Ib_7$ is dependent on an amount of the collector current of the transistor Q8, which may be controlled by collector currents of the transistors Q9 and Q10. Therefore, an amount of the base current $Ib_7$ will vary with the changing of a value of the resistor R10 which sets collector current of the transistor Q10. An output signal of the device shown in FIG. 1 is obtained from a connected terminal of the emitter of the transistor Q5 and the collector of the transistor Q6 in the buffer amplifier 14.

Figure 2A:
FIG. 2(a) shows a waveform of an input signal of the device shown in FIG. 1.
Figure 2B:
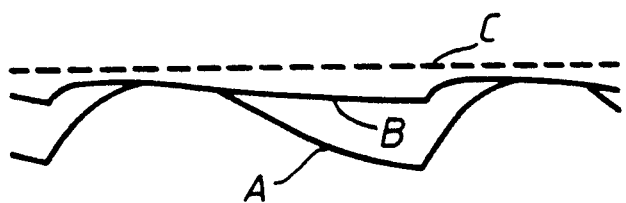
FIG. 2(b) shows waveforms of signals at a connecting terminal T2 in the device shown in FIG. 1.

When the input signal to the base of transistor Q2 in the differential amplifier 11 is a high level H as shown in FIG. 2(a), the switching transistor 12 conducts and the capacitor 13 is charged. Then, when the input signal becomes a low level L, switching transistor 12 is cut off, the capacitor 13 starts to discharge to provide input bias currents $Ib_3$ and $Ib_5$ of the differential amplifier 11 and the buffer amplifier 14 respectively. However, the input bias currents $Ib_3$ and $Ib_5$ are compensated by the base current $Ib_7$ of the transistor Q7 in the current compensating circuit 15. Thus, an amount of discharge of the capacitor 13 may be varied in accordance with the amount of the base current $Ib_7$ and a potential of the capacitor 13 may be also varied. For example, as shown in FIG. 2(b), the potential of the capacitor 13 varies from waveform A to C as the base current $Ib_7$ increases. When the base current $Ib_7$ increases, a loss of charge due to the discharge of the capacitor 13 is inclined to decrease because a compensating current for the input bias currents $Ib_3$ and $Ib_5$ increases. Nevertheless, it should be noted that, when the base current $Ib_7$ becomes greater than the input bias current $Ib_3$ plus $Ib_5$ ($Ib_7 > Ib_3 + Ib_5$), it may be impossible to detect a peak level of the input signal, because the potential of the capacitor 13 becomes higher than the high level H of the input signal in such an overcompensating condition, as shown in waveform C of FIG. 2(b). This is due to the fact that the capacitor 13 is charged by current corresponding to the difference between the base current $Ib_7$ and the input bias current $Ib_3$ plus $Ib_5$ and the switching transistor 12 is forced to be cut off because of increase of the potential of the capacitor 13. Therefore, it is necessary to set the base current $Ib_7$ to be less than the input bias current $Ib_3$ plus $Ib_5$ ($Ib_7 < Ib_3 + Ib_5$). It is easy to set such a base current $Ib_7$ by changing of the value of the emitter resistor R10 as mentioned above.

Figure 3:
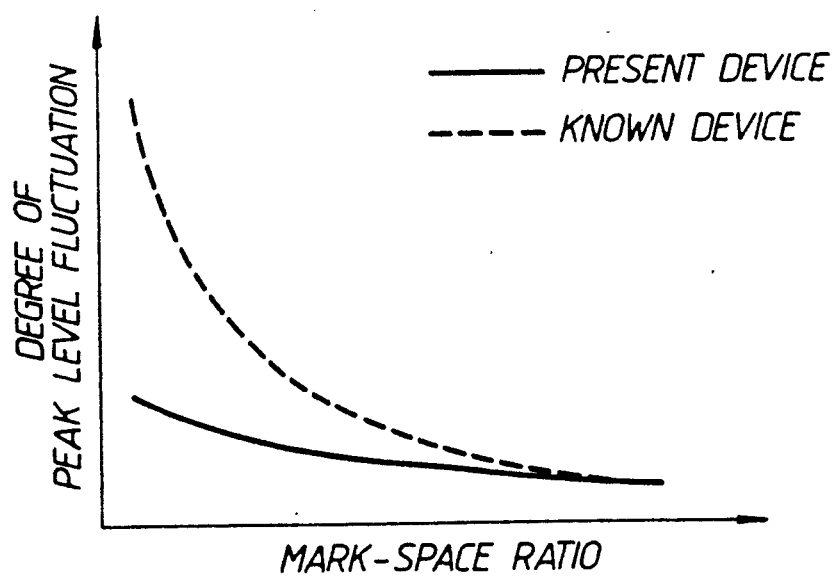
FIG. 3 shows characteristics of peak level fluctuation to the mark-space ratio of an input signal.

In the device shown in FIG. 1, base currents of the transistors Q3 and Q5 (NPN transistors) are compensated by the base current $Ib_7$ of the transistor Q7 (PNP transistors). Also, potentials of the bases of the transistors Q1, Q6 and Q10, used for current sources, are provided in common. Therefore, the base current $Ib_7$ as a bias compensating current follows a change of the input bias current caused by the change of temperature and also follows supply voltage fluctuation exceedingly. Moreover, the value of the base current $Ib_7$ may be set to a value, just before over compensating, at which the loss of charge in the capacitor 13 may be decreased to the utmost limit. In this case, charging error in the capacitor 13 may not be increased, because the current compensating circuit 15 has no effect upon frequency characteristic of the differential amplifier 11. Thus, it is possible to decrease the error of peak level detection due to change of the mark-space ratio too much. As shown in FIG. 3, the degree of peak level fluctuation as a function of the mark-space ratio in the present device (shown in a continuous line) becomes much less than that in the known device (shown in a dashed line).

Figure 4:
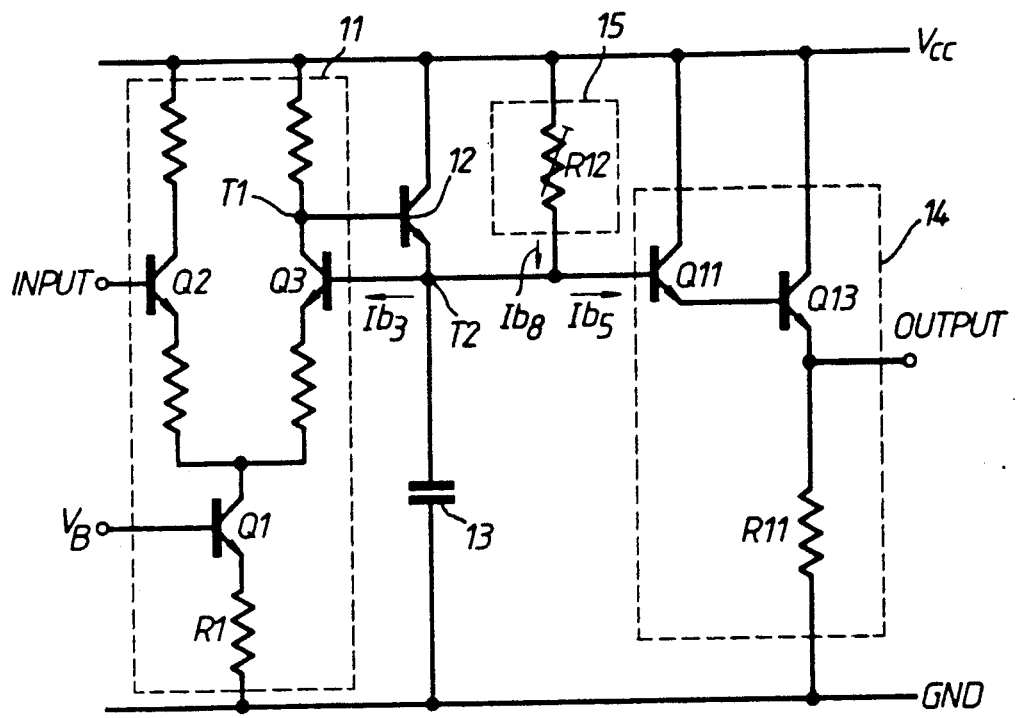
FIGS. 4 through 7 show circuit diagrams of devices according to another embodiments of this invention.

FIG. 4 shows a device according to another embodiment of this invention.

Figure 5:
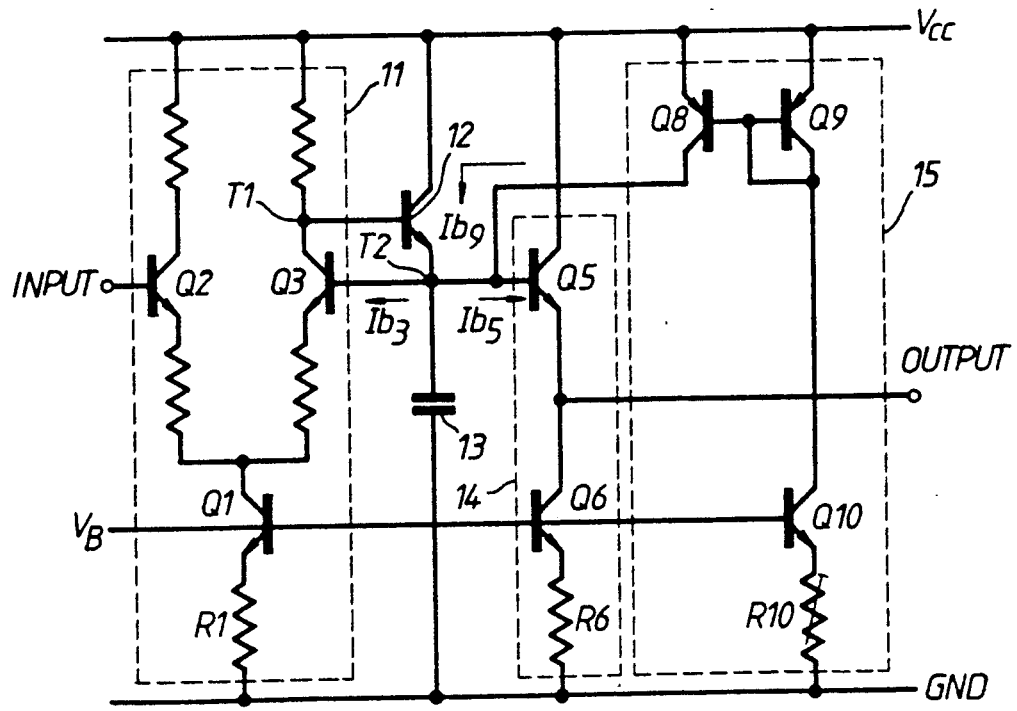

The buffer amplifier 14 has two transistor Q11 and Q12 formed of a Darlington circuit and a resistor R11. Also, the current compensating circuit 15 comprises a variable resistor R12 which is connected to the voltage source Vcc. In this device, the input bias currents of the differential amplifier 11 and the buffer amplifier 14 are compensated by a bias compensating current $Ib_8$ which is supplied from the voltage source Vcc through the resistor R12. Thus, the loss of charges in the capacitor 13 becomes less and it is possible to decrease the error of peak level detection caused by change of the mark-space ratio. FIG. 5 shows another embodiment, which shows the current compensating circuit 15 shown in FIG. 1, but without the transistor Q7. In this case, a bias compensating current $Ib_9$ of the current compensating circuit 15 is obtained from the collector of the transistor Q8 directly and is supplied to the differential amplifier 11 and the buffer amplifier 14 to compensate for the input bias currents.

Figure 6:
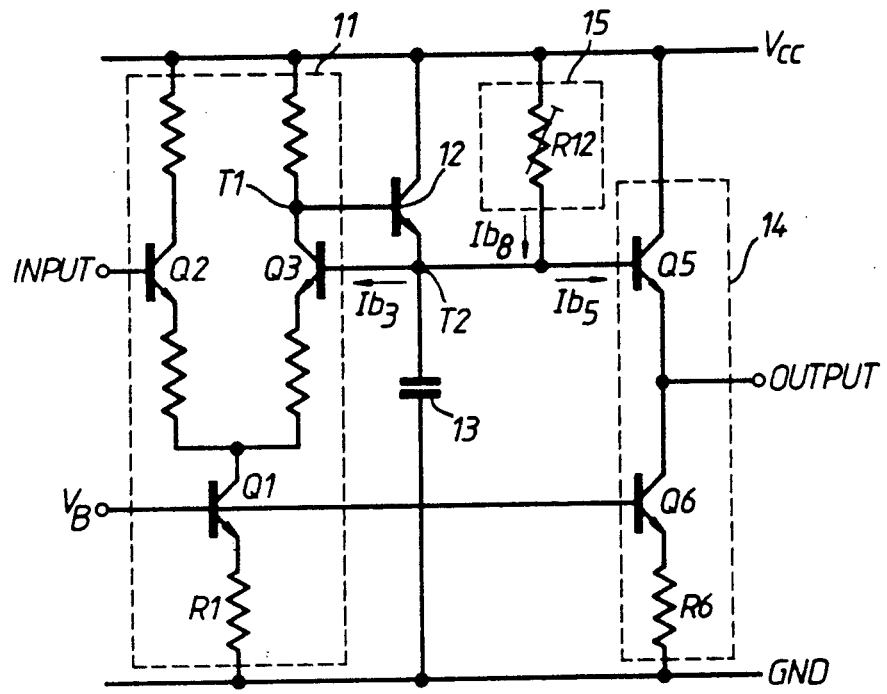
Figure 7:
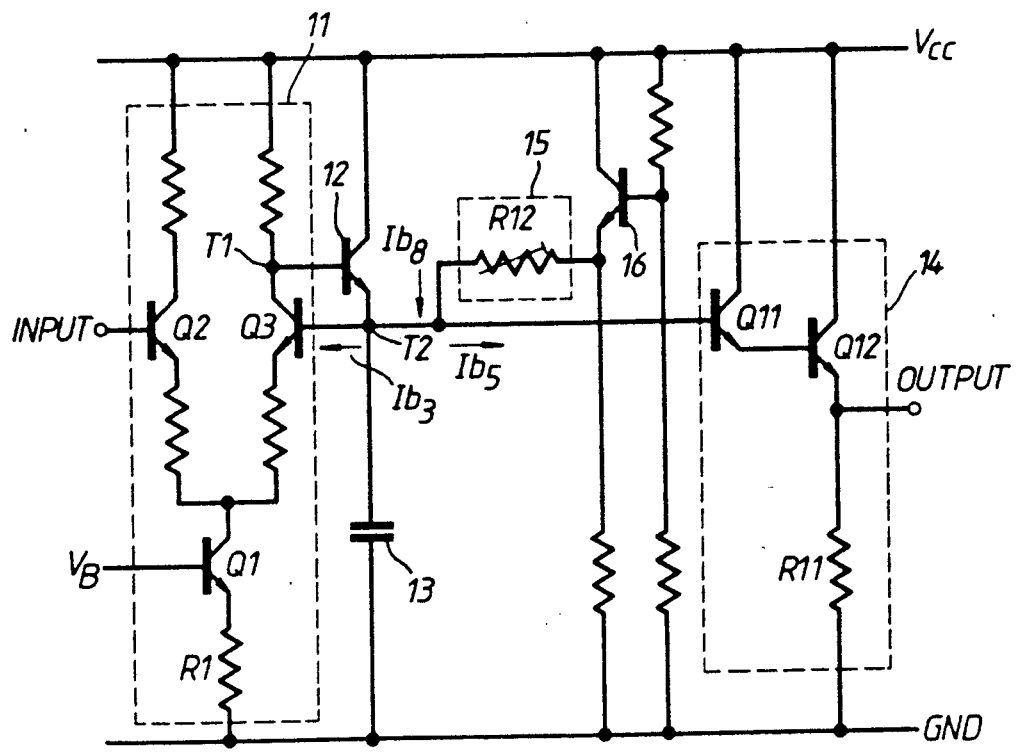
Figure 8:
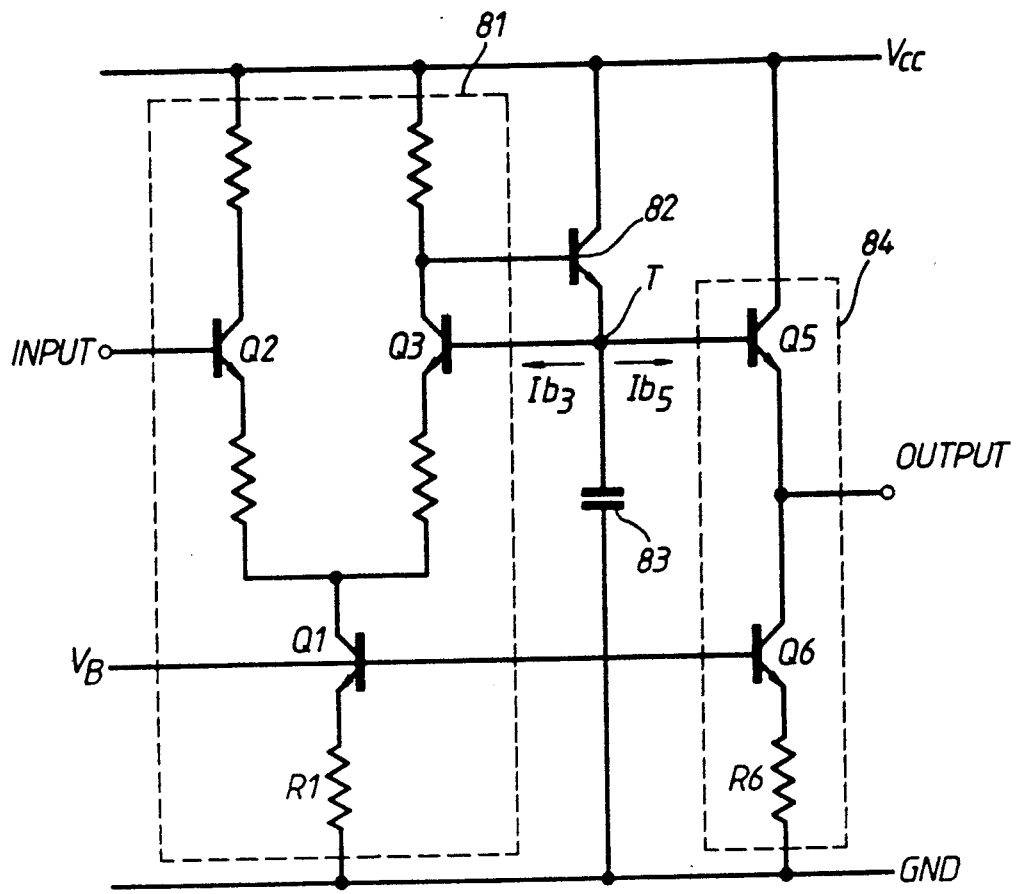
FIG. 8 is a circuit diagram of a known peak level detecting circuit.
Figure 9A:
FIG. 9(a) shows waveforms of input signals in the circuit shown in FIG. 8.
Figure 9B:
FIG. 9(b) shows waveforms of signals at a connecting terminal T in the circuit shown in FIG. 8.
Figure 9C:
FIG. 9(c) shows waveforms of output signals in the circuit shown in FIG. 8.

Also, the buffer amplifier 14 shown in FIG. 4 may be replaced with the same constitution as the amplifier 14 shown in FIG. 1, which has transistors Q5 and Q6 and a resistor R6, as shown in FIG. 6. Moreover, the variable resistor R12 shown in FIG. 4 may be connected to other than the supply voltage Vcc. FIG. 7 shows an embodiment where this is connected to an emitter of a transistor 16, which forms an emitter follower producing an output potential corresponding to a base potential.

According to the present invention, it is possible to reduce a charging error in a capacitor holding peak level of an input signal by a negative feedback control and reduce a loss of charges in the capacitor by a compensation of an input bias signal of an amplifier. Thus, it is possible to decrease an error of peak level detection too much caused by change of mark-space ratio and also compensate a characteristic to temperature of a switching transistor due to an effect of the negative feedback control. Therefore, it is possible with the present invention to provide a peak level detecting device, with a high accuracy, that is suitable for various circuits, such as an automatic gain control circuit and an alarm circuit etc.

Although only a few embodiments have been described in detail above, those having ordinary skill in the art will certainly understand that many modifications are possible in the preferred embodiment without departing from the teachings thereof.

All such modifications are intended to be encompassed within the following claims.

What is claimed is:

1. A device for detecting a peak level of an input signal, comprising:
   first amplifying means for amplifying the input signal to produce an amplified output signal;
   switching means, connected to the first amplifying means, for generating a switching signal corresponding to the amplified output signal from the first amplifying means;
   holding means, connected to the switching means, for holding a peak level of the switching signal from the switching means;
   feedback means for negatively feeding back the peak level from said holding means to the first amplifying means as a negative feedback signal;
   second amplifying means for amplifying the switching signal from the switching means; and
   compensating means for generating a bias compensating signal to compensate for a bias level of the negative feedback of said first amplifying means and a bias level of said second amplifying means, and for providing the bias compensating signal to the first and second amplifying means, said bias compensating means including means for adjusting an amount of compensation for said bias levels.

2. The device of claim 1, wherein the first amplifying means includes differential amplifying means having the input signal connected to one input and the negative feedback signal connected to another input, for producing an amplified signal corresponding to the difference between a level of the input signal and the peak level.

3. The device of claim 1, wherein the switching means includes a switching transistor supplied with the output signal from the first amplifying means.

4. The device of claim 1, wherein the holding means includes a capacitor for charging in accordance with the switching signal from the switching means.

5. The device of claim 1, wherein the compensating means includes means for producing a bias compensating current substantially equal to a drive current for driving the compensating means.

6. The device of claim 5, wherein the compensating means further includes current controlling means for controlling an amount of the bias compensating current of the compensating means.

7. The device of claim 6, wherein the current controlling means includes means for controlling an amount of the drive current.

8. The device of claim 1, wherein the first amplifying means, the second amplifying means and the compensating means, each include means for forming a current source.

9. The device of claim 8, wherein each current source forming means includes a transistor, each base of the transistor of each current source forming means which are included in the first amplifying means, the second amplifying means and the compensating means, being connected commonly and provided with the same voltage.

10. The device of claim 2, wherein the differential amplifying means includes first and second transistors, having collectors which are connected commonly through a first resistor and emitters which are connected commonly through a second resistor, a base of the first transistor being provided with the input signal and the amplified signal being obtained from the collector of the second transistor.

11. The device of claim 10, wherein the switching means includes a switching transistor, with its base being connected to the collector of the second transistor, and with its emitter being connected to the base of the second transistor and the second amplifying means.

12. The device of claim 11, wherein the holding means includes a capacitor which is connected between ground and the emitter of the switching transistor.

13. The device of claim 12, wherein the compensating means includes means for supplying the bias compensating signal to a connecting terminal between the capacitor and the emitter of the switching transistor.

14. The device of claim 1, further comprising setting means for setting a value of the bias compensating signal.

15. The device of claim 1, wherein the second amplifying means includes two transistors connected in series, the switching signal from the switching means being supplied to a base of one of the two transistors.

16. The device of claim 1, wherein the second amplifying means includes means for forming a Darlington circuit.

17. The device of claim 1, wherein the compensating means includes a variable resistor supplying output current to the first and second amplifying means as the bias compensating signal.

18. The device of claim 17, wherein the compensating means includes means for connecting the variable resistor to a voltage source.

19. The device of claim 18, wherein the connecting means includes an emitter follower and means for connecting the variable resistor to the voltage source through the emitter follower.

20. A method of detecting a peak level of an input signal, comprising the steps of:
    amplifying the input signal, as a function of an negative feedback signal, by first amplifying means to produce an amplified signal;
    generating a switching signal corresponding to the amplified signal;
    holding a peak level of the switching signal;
    feeding back the peak level as the negative feedback signal to the first amplifying means;
    amplifying the switching signal using a second amplifying means;
    adjusting an amount of bias compensation; and
    generating an adjustable bias compensating signal corresponding to said adjusted amount for supplying to the first and second amplifying means to compensate biases thereof.

21. The method of claim 20, wherein the input signal amplifying step includes the step of:
    amplifying a signal corresponding to the difference between a level of the input signal and the peak level.

22. The method of claim 20, wherein the bias compensating signal generating step includes the step of:
    producing a bias compensating current substantially equal to a drive current for driving a compensating means.

23. The method of claim 20, wherein the bias compensating signal generating step includes the step of:
    controlling a value of the bias compensating signal to a level just short of over-compensating.

24. The method of claim 22, wherein the producing step includes the step of:
    controlling a value of the drive current.

25. The method of claim 23, wherein the controlling step includes the step of:
    setting a value of the bias compensating signal which is less than sum of values of input bias signals of the first and second amplifying means.

* * * * *